United States Patent
Reddy

(10) Patent No.: US 8,239,814 B2
(45) Date of Patent: Aug. 7, 2012

(54) PARAMETER DRIFT PREDICTION

(75) Inventor: Vijay Kumar Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 297 days.

(21) Appl. No.: 12/630,920

(22) Filed: Dec. 4, 2009

(65) Prior Publication Data

US 2010/0242001 A1    Sep. 23, 2010

Related U.S. Application Data

(60) Provisional application No. 61/162,500, filed on Mar. 23, 2009.

(51) Int. Cl.
*G06F 11/22* (2006.01)

(52) U.S. Cl. .......... 716/136; 716/56; 716/132; 702/117; 703/14

(58) Field of Classification Search ............ 716/56, 716/136; 703/14; 702/117
See application file for complete search history.

(56) References Cited

U.S. PATENT DOCUMENTS

| | | |
|---|---|---|
| 6,933,731 B2 | 8/2005 | Reddy et al. |
| 7,026,838 B2 | 4/2006 | Reddy et al. |
| 7,212,023 B2 | 5/2007 | Krishnan et al. |
| 7,218,132 B2 | 5/2007 | Krishnan et al. |
| 2003/0233624 A1 | 12/2003 | Reddy et al. |
| 2008/0071511 A1* | 3/2008 | Lin .......................... 703/14 |
| 2009/0167429 A1 | 7/2009 | Reddy et al. |

* cited by examiner

*Primary Examiner* — Vuthe Siek
*Assistant Examiner* — Brian Ngo
(74) *Attorney, Agent, or Firm* — Steven A. Shaw; W. James Brady; Frederick J. Telecky, Jr.

(57) ABSTRACT

A set of parameter drifts is recorded over a period of time for each of a series of stress tests on a system at various stress levels. Each set of the recorded parameter drifts is plotted as parameter drift versus time. The plots are then time shifted in relation to a reference plot to form a single parameter drift plot. A non-linear equation is fitted to the single parameter drift plot and then used to predict parameter drift over the life of the system.

The non-linear equation may be modified by adding a stress acceleration factor to allow prediction of parameter drift over time at different stress levels.

14 Claims, 8 Drawing Sheets

PARAMETER DRIFT PREDICTION

CLAIM OF PRIORITY UNDER 35 USC 120

The present application claims priority to Provisional Patent Application No. 61/162,500, entitled "A METHOD FOR DETERMINING PRODUCT LIFETIME AND END-OF-LIFE PERFORMANCE PARAMETER DRIFT" that was filed Mar. 23, 2009 and is incorporated by reference herein in its entirety.

FIELD OF THE INVENTION

This invention generally relates to the field of circuit design and in particular to estimation of parameter drift over the life of the circuit.

BACKGROUND OF THE INVENTION

In personal communications systems such as cell phones, low cost, high performance and reliability are important and ongoing goals. To reduce costs in such modern communications devices, there is a trend to convert analog circuits into digital architectures that can be more easily implemented in integrated circuit chips and/or in embedded circuit devices and to integrate previously discrete devices. To make and operate a low cost communications device, some components are stressed up to and beyond normal operation parameters for brief periods of time. Over time, an accumulation of stress applied to the components can slowly cause progressive degradation of the components and result in eventual failure to meet a desired component or system specification.

During the design process, guard band margins are included within the design to accommodate parameter drift over the life of the product. The conventional reliability method works for the cases where the performance parameter degradation is linear in a log-degradation versus log-time space. End of life (EOL) parameter drift is conventionally predicted based on a straight line extrapolation using data obtained from short term accelerated testing. The conventional method can overestimate the amount of EOL parameter drift and therefore result in conservative guard band margins. This can result in less competitive products that consume more area and power.

SUMMARY OF THE INVENTION

A set of parameter drifts is recorded over a period of time for each of a series of stress tests on a system at various stress levels. Each set of the recorded parameter drifts is plotted as parameter drift versus time. The plots are then time shifted in relation to a reference plot to form a single parameter drift plot. A non-linear equation is fitted to the single parameter drift plot and then used to predict parameter drift over the life of the system.

The non-linear equation may be modified by adding a stress acceleration factor to allow prediction of parameter drift over time at different stress levels.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Many transistor reliability mechanisms result from degradation of the oxide/silicon interface. The defects that are generated due to the operating voltage typically exhibit a distribution of bond-breaking energies. The defect generation proceeds with the lower bond-breaking energies defects being activated and then moving on to the higher bond-breaking energies (i.e., harder) defects. Such a scenario results in a parameter shift that is non-linear in a log(y)-log(x) space where, for example, y=output power and x=time. Standard reliability extrapolations can not handle the non-linear nature as they use a linear (in log-log space) extrapolation approach. The linear approach in the log-log space arises if the defect distribution is of a single energy nature or very tightly distributed. The non-linear nature of the drift in the logy-logx space can be observed if the parameter drift exhibits some level of saturating behavior.

A model is provided that is more accurate over time and environmental conditions such as temperature for systems in which parameter drift is non-linear. An acceptable level of component or system performance and reliability can therefore be achieved despite stresses beyond normal operational parameters while maintaining reduced component size and power consumption. The conventional straight line method can overestimate the amount of end of life (EOL) parameter drift and therefore result in conservative guard band margins. This can result in less competitive products that consume more area and power.

A set of parameter drifts is recorded over a period of time for each of a series of stress tests on the system at various stress levels. Each set of the recorded parameter drifts is plotted as parameter drift versus time. The plots are then time shifted in relation to a reference plot to form a single parameter drift plot. A non-linear equation is fitted to the single parameter drift plot and then used to predict parameter drift over the life of the system. The non-linear equation may be modified by adding a stress acceleration factor to allow prediction of parameter drift over time at different stress levels.

This method is ideally suited for predicting reliability performance where the degradation has some level of saturating behavior. In one embodiment that is described in more detail below, a method to determine end of life parameter drift for different operating voltages given a very strong non-linear behavior is provided.

Figure 1:
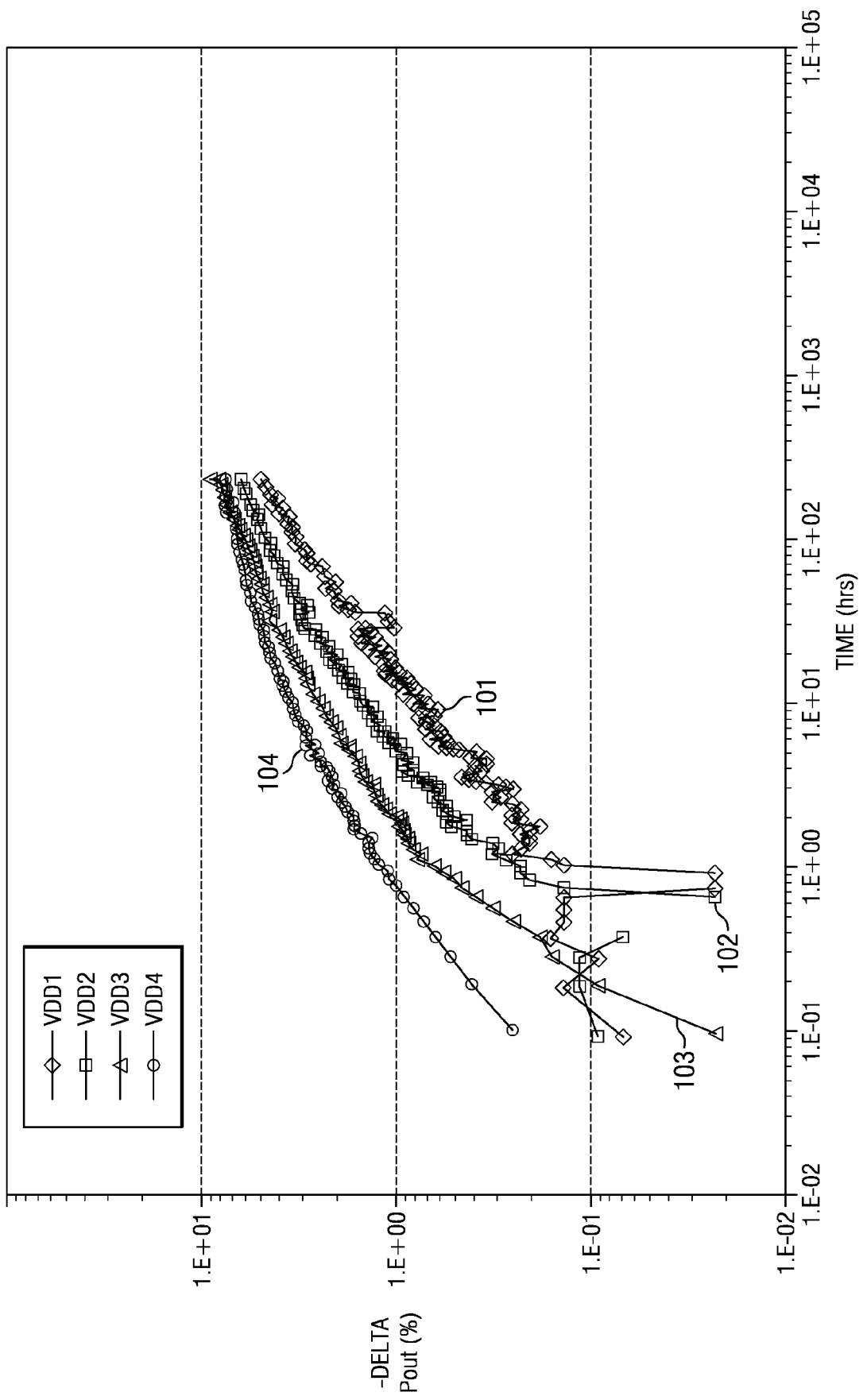
FIG. 1 is a plot of parameter drift versus time for a series of stress tests.

FIG. 1 is a plot of parameter drift versus time for a series of stress tests performed on an exemplary system. In this example, the exemplary system is a digital radio receiver/ transmitter system for use in a cellular radio, which will be described in more detail with regard to FIGS. 9-10. A particular parameter that is of interest for this example is output power of an output amplifier that amplifies a Gaussian filtered minimum shift keying, (GMSK) signal that will be transmitted by the digital radio transmitter. However, embodiments of the invention are not limited to any one particular parameter or type of system. Other embodiments of the system are applicable to any type of system in which a parameter of interest has a drift characteristic that is non-linear over time.

Accelerated stress tests are performed where the voltage is accelerated over the normal expected operating voltages. For this example, a series of stress tests are performed on the system by applying a series of supply voltages (VDD) to the output amplifier of the transmitter while the transmitter is operated for a period of time. For example, the transmitter is operated with VDD=1.4V for 250 hours (2.5 E+2) with a fixed test signal and the output power is measured periodically over the duration of the accelerated stress test time period and a percentage drift from an initial value is calculated for each measured value. This set of data is plotted as curve 101 in FIG. 1 as percentage of parameter drift (y) versus time (x) on a log(y)-log(x) space. Similarly, 250 hours tests are performed at VDD=1.5V, 1.6V and 1.7V and the resulting data plotted as plots 102, 103, and 104, respectively.

Figure 5:
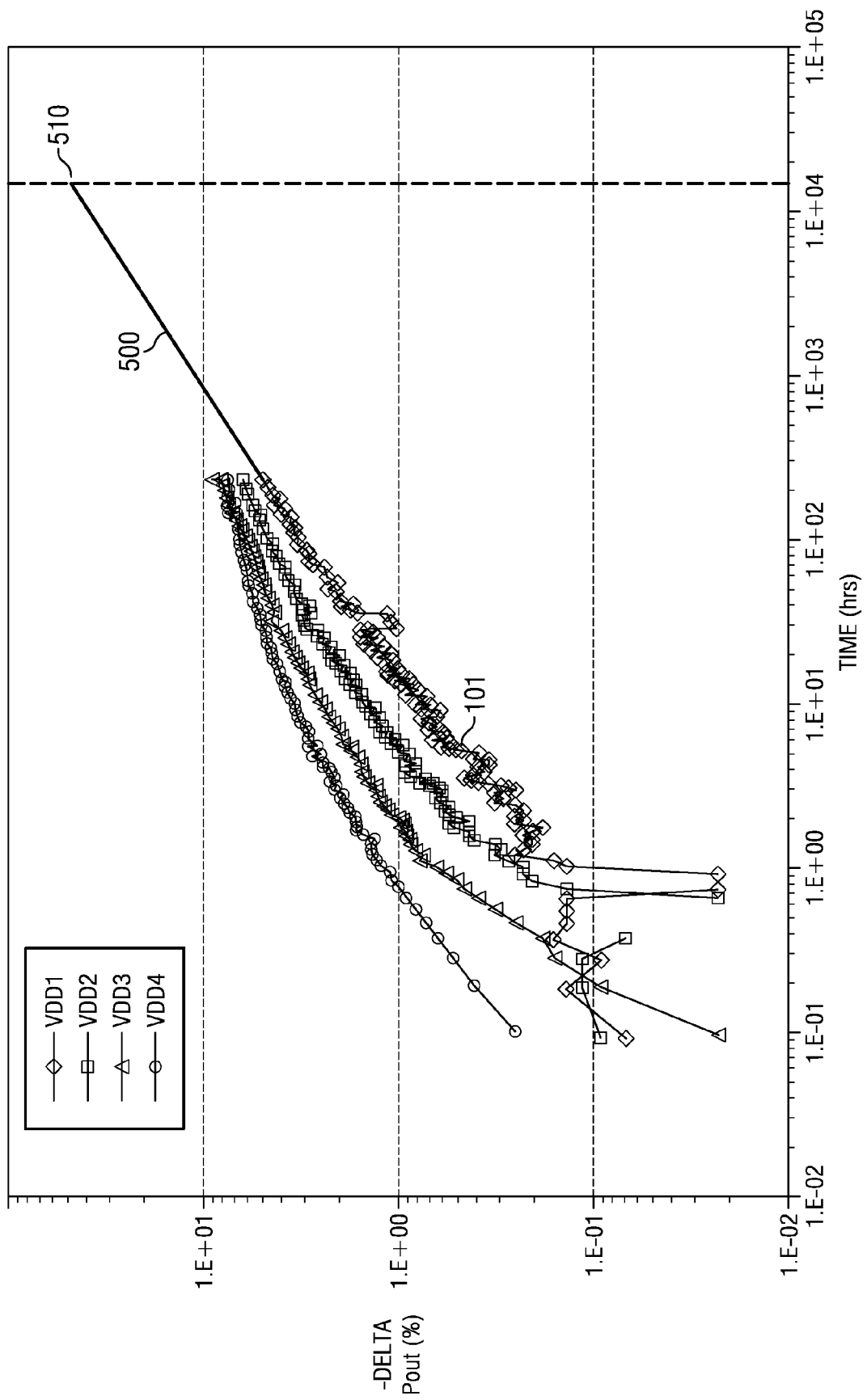
FIG. 5 illustrates a typical straight line projection of the data of FIG. 1.

Notice that at the voltage level of 1.4V in plot 101, a fairly linear parameter drift occurs over the short time period of 250 hours during the stress test. However, at the higher stress levels, such as 1.7V in plot 104, it is clear that a non-linear relation of parameter drift over time is present. Previously, prediction of parameter drift over the life of the system would be based on a straight line extrapolation of the plots, as illustrated for this set of data in FIG. 5. In order to provide a more accurate prediction of parameter drift over time the non-linear nature of the parameter drift mechanism must be taken into account. This can be done by performing a lateral time shift (LTS) of the various plots 102-104 so that they align with the nominal voltage plot 101. In this example, 1.4V is chosen as a reference operating voltage of the amplifier, so plot 101 is selected as the nominal plot.

Figure 2:
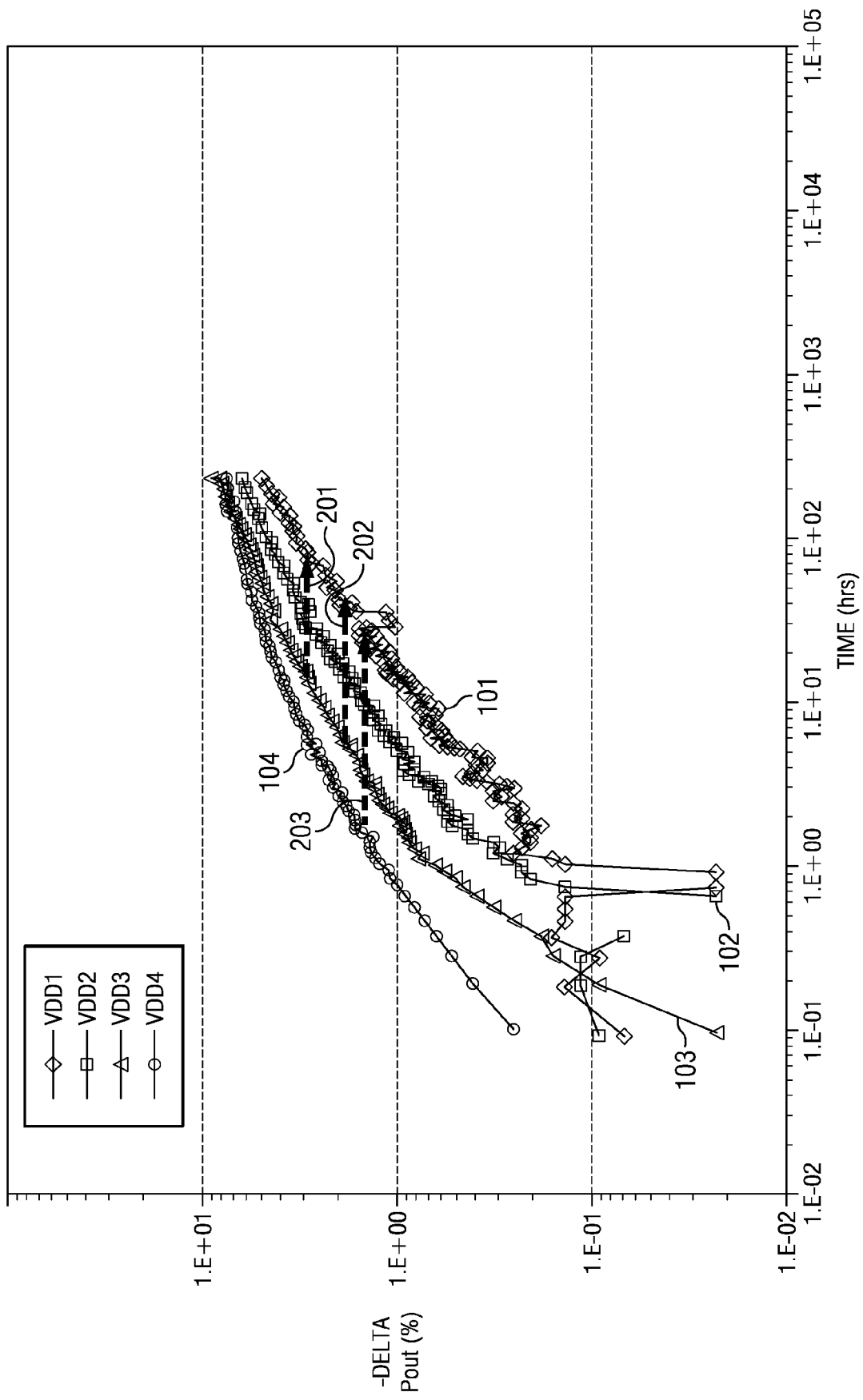
FIG. 2 illustrates time shifting of the plots.
Figure 3:
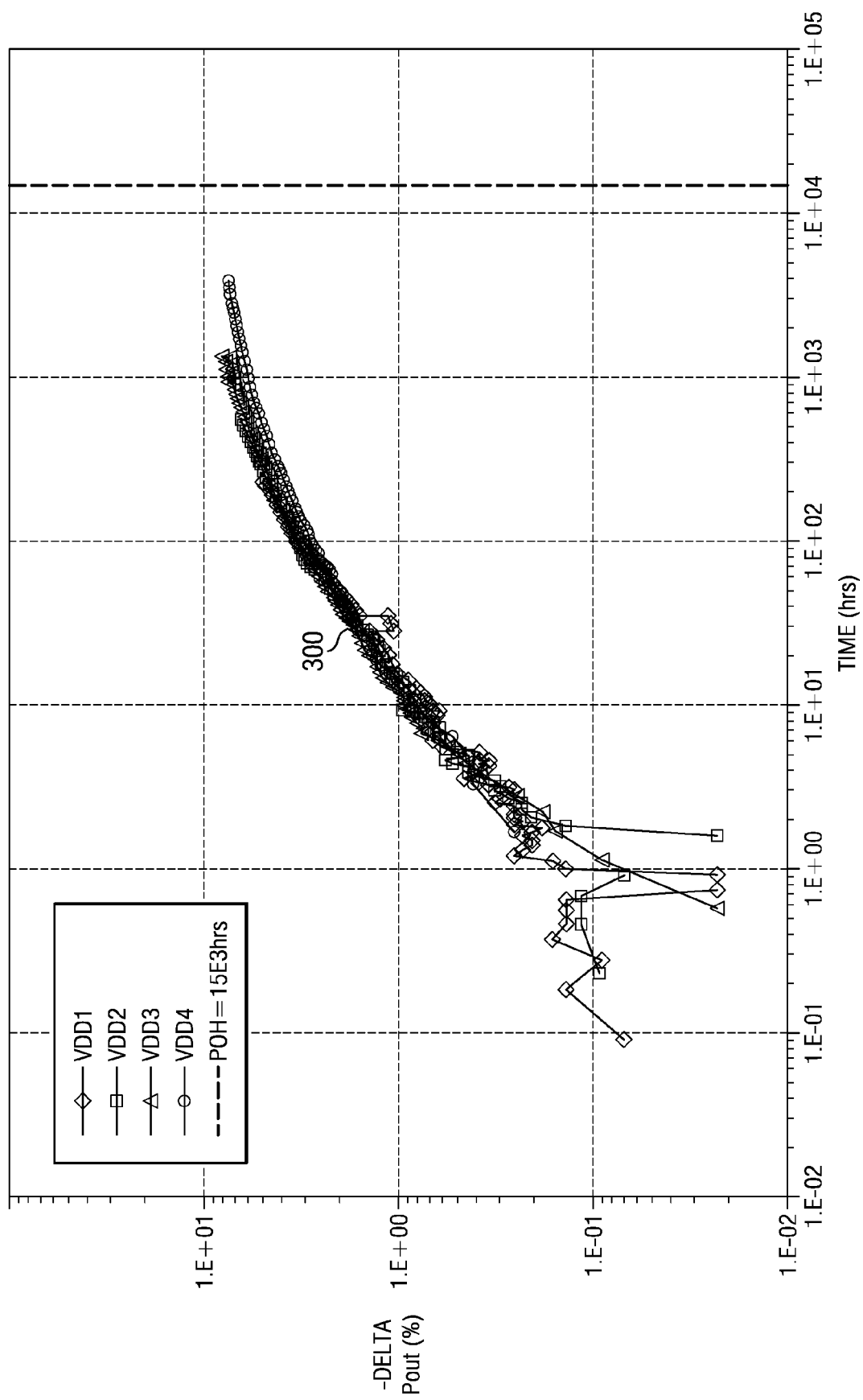
FIG. 3 illustrates overlayment of the time shifted plots.
Figure 4:
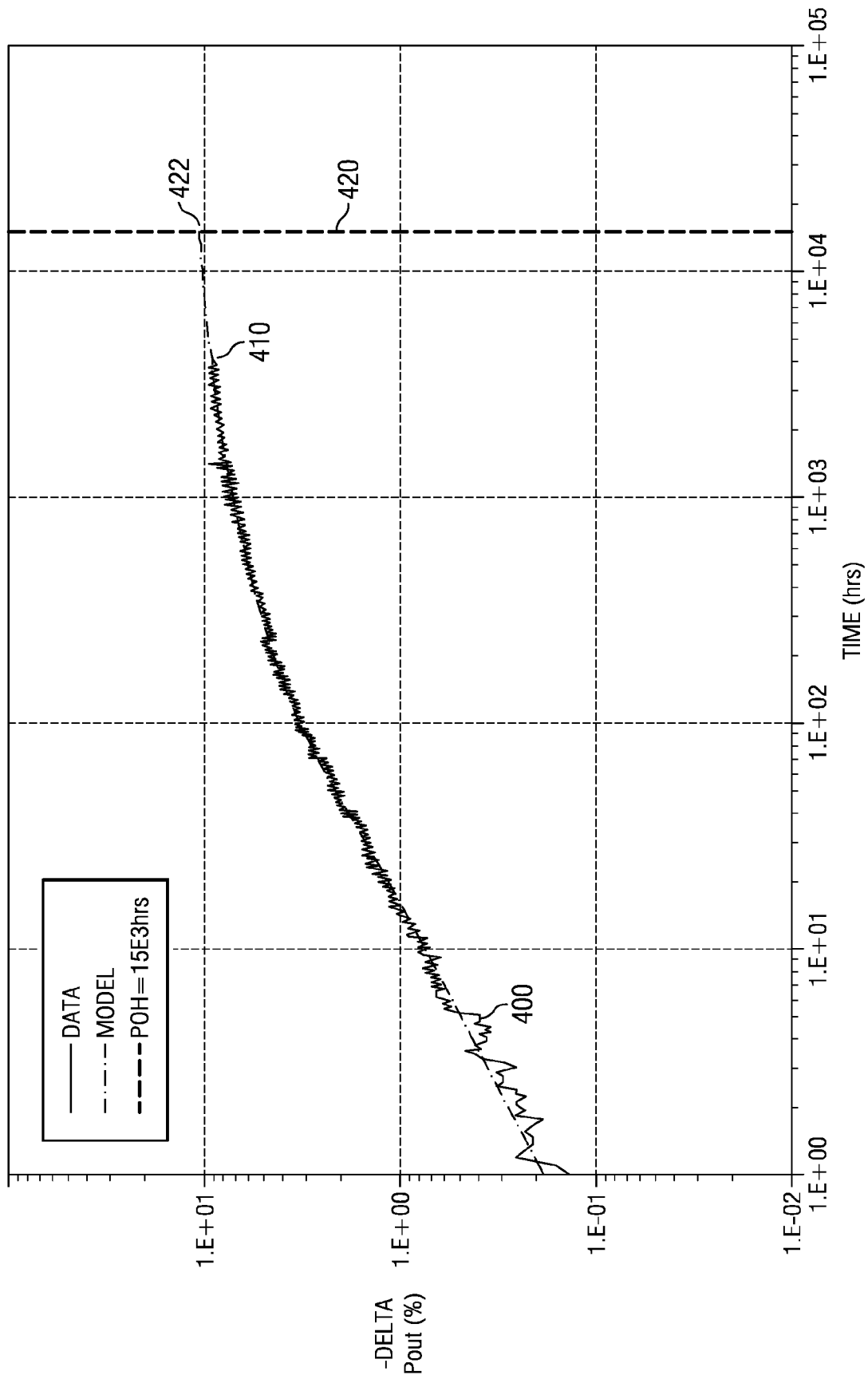
FIG. 4 illustrates a non-linear model fitted to the overlaid plot of FIG. 3.

Referring to FIG. 2, plot 102 is time shifted by LTS 201, plot 103 is time shifted by LTS 203 and plot 104 is time shifted by LTS 204. The LTS for each plot is selected so that each plot is overlaid on nominal plot 101 to form a single plot 300 as illustrated in FIG. 3. The time shifted data from all of the tests is then re-plotted as a single plot 400 as illustrated in FIG. 4. Notice that in FIG. 4 some of the scattered data from the beginning of the stress test time period is not illustrated.

A multi-parameter non-linear equation 410 is then fit to this generalized, universal curve 400. This fitting can be done using known software that is capable of performing non-linear regression, such as Matlab, DataFit, or Excel Trendline, for example. In this example, equation (1) represents parameter drift at nominal voltage.

$$\text{Delta Pout}(\%) = A_1 * t^n / (1 + A_2 * t^n) + A_3 * t^m / (1 + A_4 * t^m) \quad (1)$$

where:
$A_1 = 0.186$
$A_2 = 1.73\ E\text{-}02$
$n = 0.615$
$A_3 = 2.28\ E\text{-}04$
$A_4 = 1.93\ E\text{-}04$
$m = 1.99$ This equation predicts parameter drift over time beyond the length of the accelerated stress test. For example, line 420 indicates 15,000 hours (1.5 E+04), which may be an assumed end of life for the exemplary system. In this example, after 15,000 hours of operation at nominal voltage, the output power parameter is predicted to have drifted by approximately 10%, as indicated at point 422 on model plot 410.

Referring again to FIG. 5, which illustrates a straight line projection 500 of the nominal accelerated stress test data 101, the output parameter is predicted to have drifted by nearly 60% as indicated at point 510. Clearly, when designing a system, use of the non-linear projection of FIG. 4 as opposed to use of the linear projection of FIG. 5 allows a designer of the system to produce a more cost effective system since a much lower allowance needs to be made in the design of the system to accommodate parameter drift over the life of the system when the system is designed according to the non-linear projection.

Figure 6:
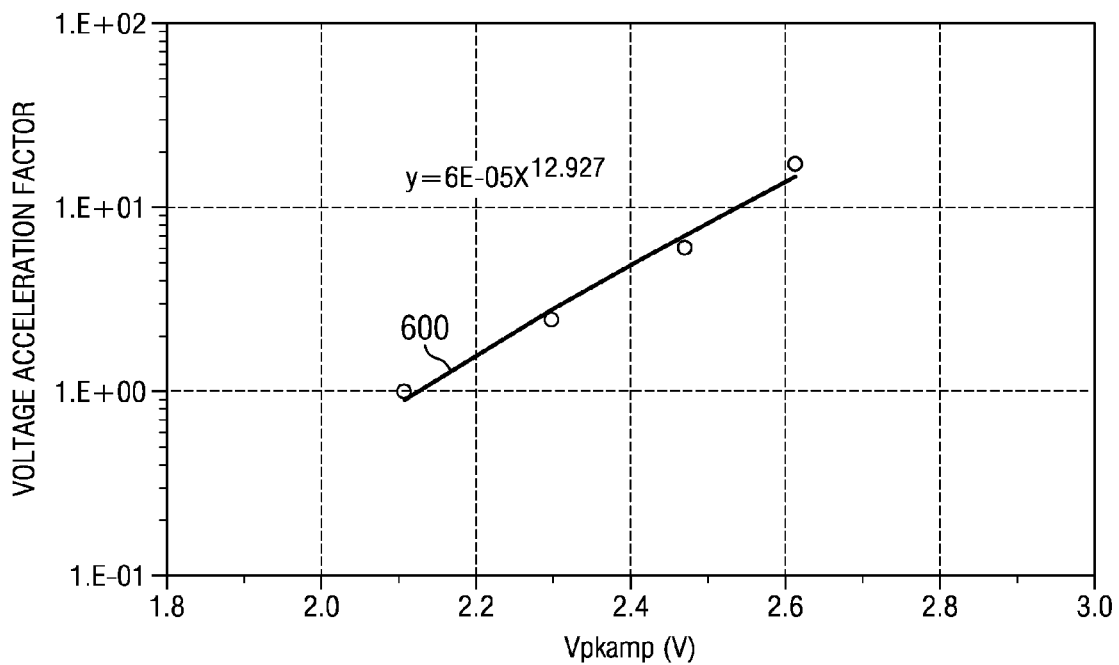
FIG. 6 illustrates a plot of lateral time scaling vs stress level for the plots of FIG. 2.

While designing a system, it may be prudent to predict parameter drift at voltages other than at a reference voltage. In this case, a stress acceleration factor may be added to equation (1). In this example, the stress level is voltage; therefore a the stress acceleration factor is determined by plotting the amount of lateral time shift versus the stress voltage, as illustrated in FIG. 6 by plot 600. In this example, the voltage to be used is the peak voltage swing of the amplifier output, Vpkamp. The signal is assumed to be a sinusoidal waveform driving a 50 ohm load where there is a DC offset value of Vdd and an AC (sine wave) swing of magnitude which is represented by equation (2).

$$Vpkamp = VDD + sqrt\{Pout\ (Watts) * 2 * 50\ ohms\} \quad (2)$$

Referring again to FIG. 6, plot 600 may be represented by a fitted equation, which in this example is equation (3).

$$Y = 6E\text{-}05 X^{12.927} \quad (3)$$

where Y is the equivalent time at a Vpkamp value of X.

In the case where X equals the reference voltage, Y equals the value of 1.0. To account for the more general case where the desired operating voltage is different from the reference voltage, Equation (3) can be substituted into Equation (1) to scale each occurrence of "t" in equation (1) to form equation (4).

$$\Delta Pout(\%) = \frac{A_1 * (6E-05 * V_{pkamp}^{12.93} * t)^n}{1 + A_2 * (6E-05 * V_{pkamp}^{12.93} * t)^n} + \frac{A_3 * (6E-05 * V_{pkamp}^{12.93} * t)^m}{1 + A_4 * (6E-05 * V_{pkamp}^{12.93} * t)^m} \quad (4)$$

Non-linear equation (4) can then predict the EOL parameter drift as a function of time and voltage.

Depending on the type of circuit that is being characterized, a range of stress levels may be represented by a non-linear equation such as equation (4). The range of stress levels is dependent on the technology of the circuit. In the example circuit of FIGS. 9-10 that operate at a nominal voltage of 1.4 volts, it has been determined that a voltage range of approximately 1.0-1.6 times the nominal voltage of 1.4 volts may be accurately modeled by equation (4). If too large of a voltage is used, then other breakdown mechanisms may come into play that are beyond the predictive ability of equation (4).

Figure 7:
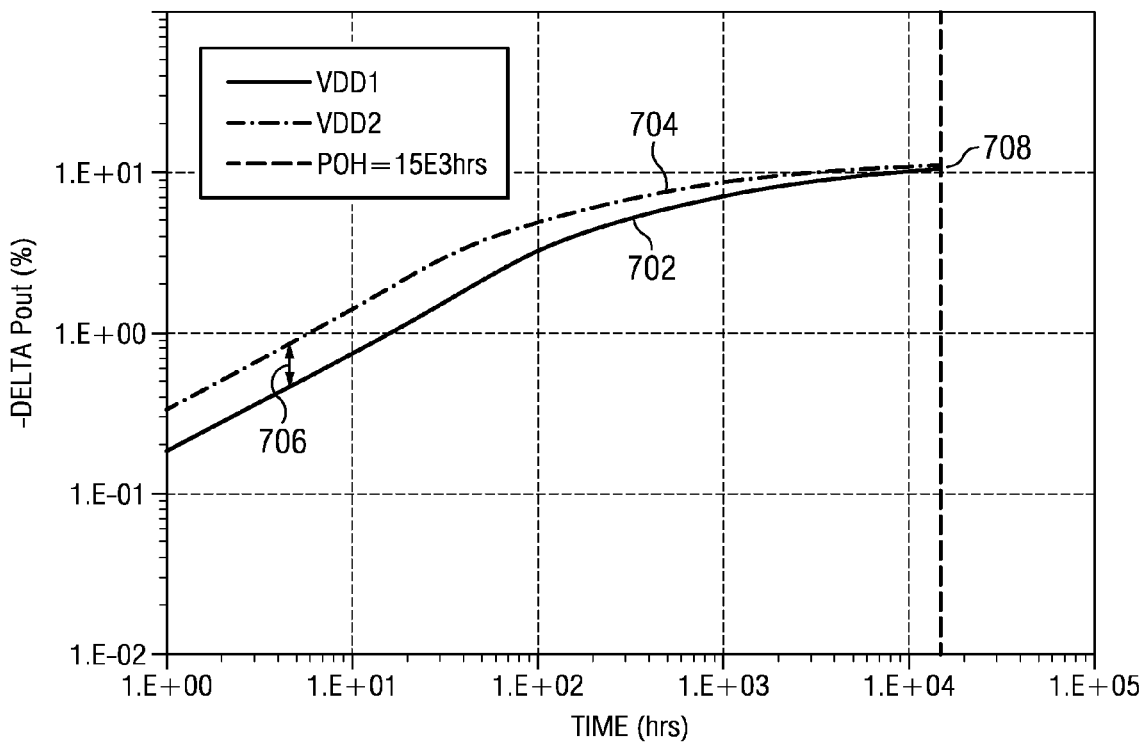
FIG. 7 is an illustrative plot of equation (4) for two values of stress level.

FIG. 7 is an illustrative plot of equation (4) for two values of stress level. Plot 702 represents a first stress level corresponding to an operating voltage VDD1. Plot 704 represents a second stress level corresponding to an operating voltage VDD2 that is higher than VDD2. In this example, each value of VDD is plugged into equation (2) to determine a value of Vpkamp, which is then plugged into equation (4). Each plot 702, 704 is then produced by solving equation (4) over the range of time illustrated in FIG. 7 using the respective value of Vpkamp. As can be seen in this example at time point 706, during early time in the life of the system, a higher stress level will produce a higher parameter drift. However, due to the non-linear parameter drift characteristics, parameter drift at a later time in the life of the system will tend to converge, as illustrated at time point 708.

Figure 8:
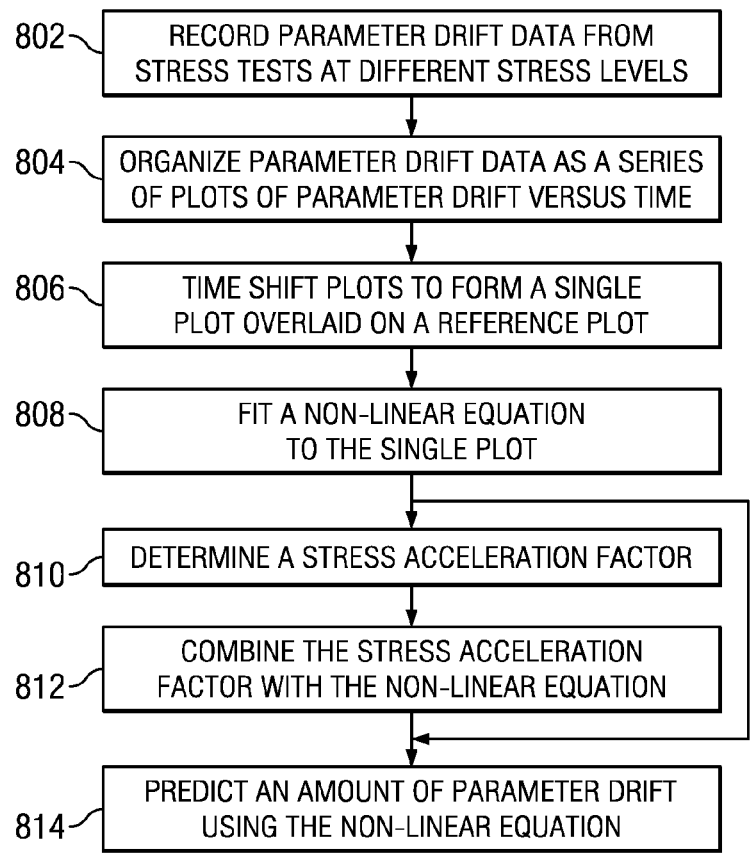
FIG. 8 is a flow diagram illustrating a method for prediction of non-linear parameter drift over time.

FIG. 8 is a flow diagram illustrating a method for prediction of non-linear parameter drift over time. As discussed above, accelerated stress tests are performed 802 where the stress level is accelerated over the normal expected operating stress level. A series of tests are performed at different stress levels. In some embodiments, the stress levels may be selected to be in a range that is both lower and higher than a nominal operating point; in other embodiments the stress levels may be selected to be in a range from the nominal operating point to a higher level.

A performance parameter of interest, i.e., output power in this example, is measured versus stress time for the different operating stress levels and plotted 804 on a log(y) versus log(time) graph, where y=output power. In some embodiments, the plotting may be performed on a physical media such as on paper, or displayed on a screen of a test system computer monitor, for example. In other embodiments, the plotting may be done in a virtual manner as data structures within a computer memory by software executed by the test system or by another computer system that receives data from the test system. In such an embodiment, there may not be an actual human viewable form of the plots, instead they are operated on only by the software in the computer system.

One of the plots is selected as a reference curve, which may represent the normal, or nominal, operating stress level of the circuit or module that is being characterized. The other parameter drift curves are then time-shifted 806 to overlay on top of the selected reference curve. If the range of stress levels is a range that is both lower and higher than the nominal operating point, then the curves representing stress lower than the nominal operating voltage may need to be shifted to the left to overlay the nominal curve, referring again to FIG. 2. The curves representing higher than nominal stresses are usually time shifted to the right to overlay the nominal curve.

A multi-parameter non-linear equation is then fit 808 to this generalized, universal curve. In this embodiment, since the data is being fit to a non-linear curve, non-linear least squares fitting is used. This fitting can be done using known software, such as Matlab, for example. Any method can be used to do the fitting but some sort of non-linear regression may be required due to the nature of the data. Other equation forms can be used if they are able to fit the data. The equation used here works well for this parameter and stress factor.

This non-linear equation can then predict 814 the EOL parameter drift as a function of time. As discussed above, depending on the type of circuit that is being characterized, a range of stress levels may be represented by a non-linear equation such as equation (4). The range of stress levels is dependent on the technology of the circuit. In the example circuit of FIGS. 9-10 that operate at a nominal voltage of 1.4 volts, it has been determined that a voltage range of approximately 1.0-1.6 times the nominal voltage of 1.4 volts may be accurately modeled by equation (4). If too large of a voltage is used, then other breakdown mechanisms may come into play that are beyond the predictive ability of equation (4).

The amount of lateral time scaling required may be plotted versus the stress level to determine 810 a stress acceleration factor, as described in more detail with regard to FIG. 6. For the example of FIG. 6, the stress acceleration factor is peak voltage swing of the amplifier output, Vpkamp, as described above.

The stress acceleration factor is combined 812 with the fitted non-linear equation to form a non-linear equation that is dependent on both time and stress level. This non-linear equation can then predict the EOL drift as a function of time and stress level. With the proper choice of stress voltages, the time-shifted drift can be equivalent to EOL operating conditions.

Typically, the reference curve represents the expected nominal operating point for the system over time. However, the selected reference curve may represent an operating point that is less than nominal or larger than nominal. The procedure discussed above determines the voltage acceleration factor and is used to extrapolate to voltages outside the measured range. However, as discussed above, depending on the type of circuit that is being characterized, a range of stress levels may be represented by a non-linear equation such as equation (4). The range of stress levels is dependent on the technology of the circuit. In the example circuit of FIGS. 9-10 that operate at a nominal voltage of 1.4 volts, it has been determined that a voltage range of approximately 1.0-1.6 times the nominal voltage of 1.4 volts may be accurately modeled by equation (4). If too large of a voltage is used, then other breakdown mechanisms may come into play that are beyond the predictive ability of equation (4).

Figure 9:
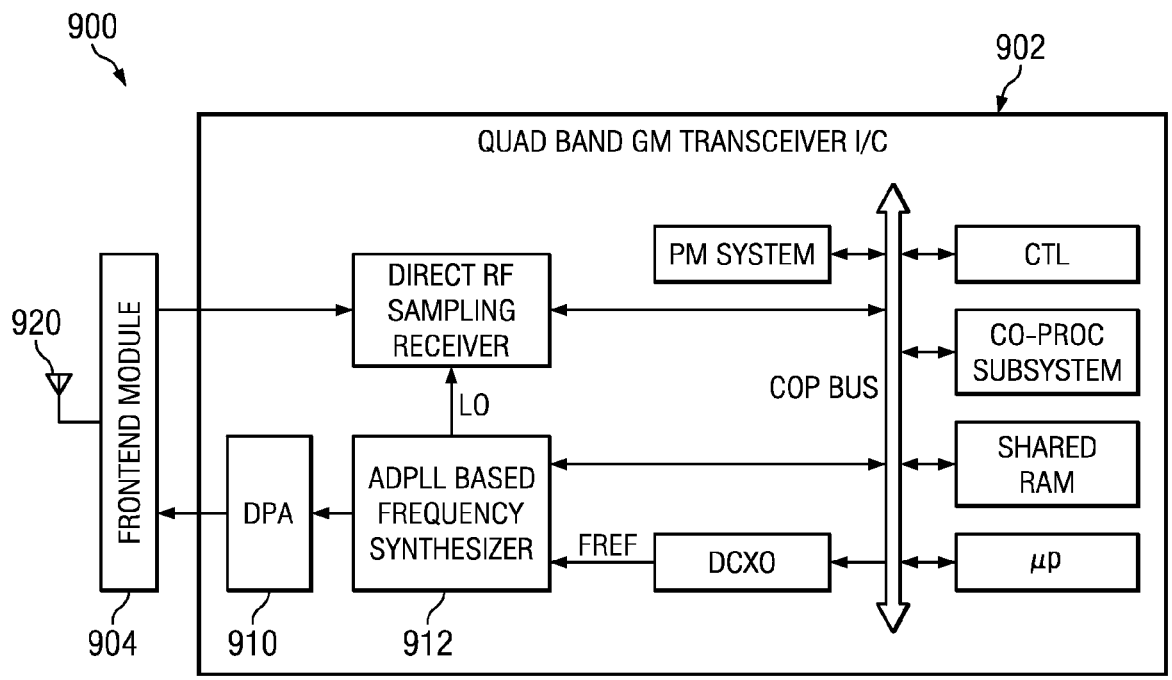
FIG. 9 is a block diagram of an exemplary system that utilizes the projection of non-linear parameter drift of FIG. 7.

FIG. 9 is a block diagram of an exemplary system 900 that utilizes the projection of non-linear parameter drift of FIG. 7. System 900 is a digital radio transceiver for use in a cellular telephone. Block 902 is a quad band GSM transceiver integrated circuit (IC) that embodies an entire digital radio transceiver. Front end module 904 receives signals from antenna 920, amplifies them in a low noise manner and provides them to a direct radio frequency sampling receiver in IC 902. An all digital phase locked loop module 912 performs modulation of a carrier signal derived from reference signal generated by an oscillator DCXO. The modulated signal is then amplified by digital pre-amplifier 910 and then sent to the front end module for final amplification and transmission via antenna 920. The receiver and transmitter blocks are controlled by a microprocessor (μp) and a coprocessor that are both coupled to a shared random access memory (RAM). Data received via the receiver and transmitted via the transmitter are managed by the microprocessor and co-processor. A power monitoring system (PM) controls power levels within the IC and reduces power to conserve energy when data is not being transmitted. The general theory of operation for cellular radio transceivers is known and does not need to be described further herein, since it is not important for embodiments of the present invention.

Figure 10:
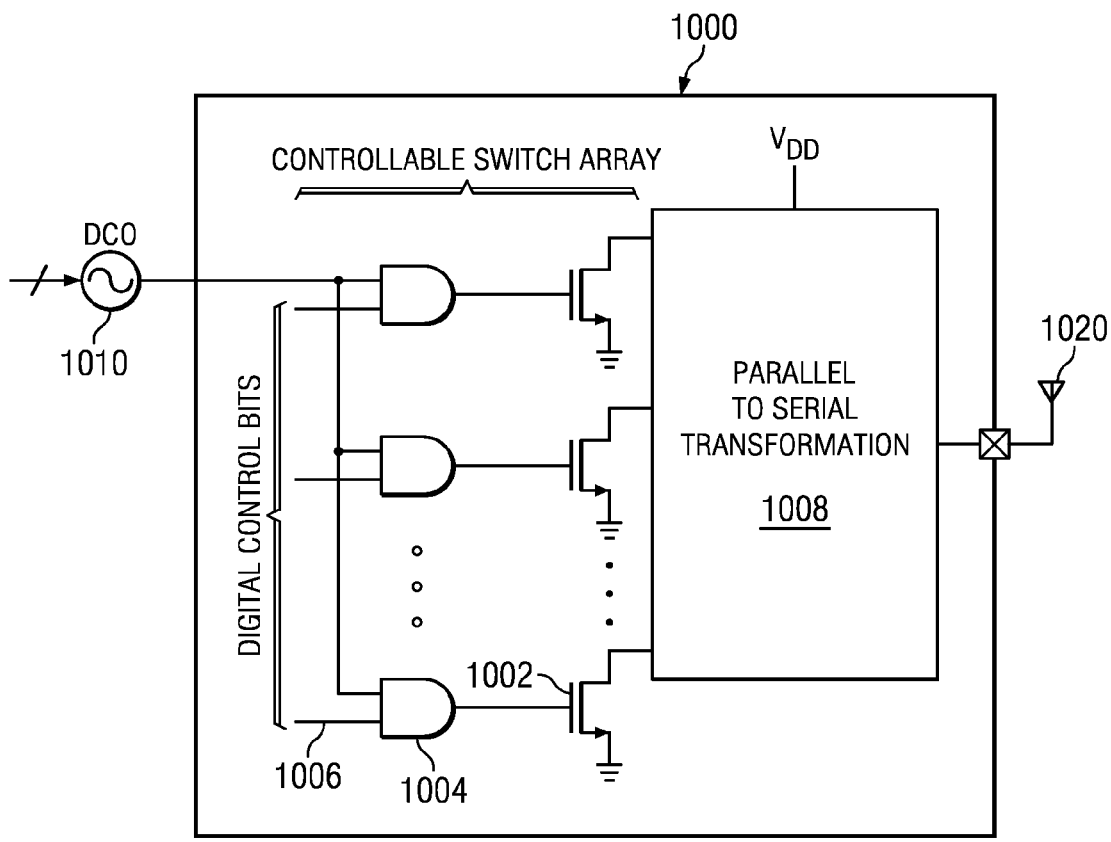
FIG. 10 is a block diagram of an amplifier that exhibits non-linear parameter drift.

FIG. 10 is a block diagram of an amplifier 1000 that may be used as pre-amp 910 in the system of FIG. 9. Digitally controlled oscillator (DCO) 1010 is representative of ADPLL 912. Digital control bits 1006 control a set of gates 1004 that in turn control a set of switching transistors 1002. Parallel to serial transformation circuit 1008 forms an amplified version of the signal received from DCO 1010 with a gain determined by switching transistors 1002.

Amplifier 1000 may exhibit non-linear drift in the value of its output power due to degradation of an oxide/silicon interface in gate structures switching transistors 1002. Transistors within parallel to serial transformation circuit 1008 may also degrade in a non-linear manner for the same reason. The defects that are generated due to the operating voltage typically exhibit a distribution of bond-breaking energies, as described earlier.

Amplifier 1000 must be designed to operate within a specified tolerance of output power over its entire life. In order to do that, enough margin is included within the design of amplifier 1000 to account for a predicted amount of output power drift due to factors such as oxide/silicon degradation over time. An initial prototype of amplifier 1000 may be fabricated and then subjected to a series of accelerated stress tests, as described above, to determine a non-linear parameter drift prediction equation, similar to equation (1) or equation (3). An accurate prediction of parameter drift may then be determined for a specified end of life using the non-linear prediction equation. Knowing the amount of drift produced by the prototype circuit, the design of the amplifier may then be modified if needed to maintain operation of the amplifier within required parameters over its lifetime.

Similarly, a complete system such as digital radio IC 902 may be subjected to a series of accelerated stress tests, as described above, to determine a non-linear parameter drift prediction equation, similar to equation (1) or equation (3) for output amplifier 910. An accurate prediction of parameter drift may then be determined for a specified end of life using the determined non-linear prediction equation. The results of the predicted parameter drift over the life of the system may be used during the design process of the system to determine if the system design has adequate operational margins. If the predicted parameter drift is too large, refinements in the design of the system may be required to increase operational margins. Alternatively, by using the non-liner equation to predict end of life parameter drift at different operating stress levels, an operating range may be selected for the system that maintains EOL parameter drift within an acceptable range.

In another embodiment, several test circuits, such as power amplifier 1000, may be fabricated. In a first one, transistors 1002, for example, are designed with a particular gate geometry. In a second one, transistor 1002 are designed with a different gate geometry, etc. Accelerated stress testing may be performed on each of the test circuits and a corresponding non-linear equation may be determined that characterizes the performance of each transistor geometry. In this manner, a set of equations may be determined that cover a range of transistor geometry. For example, the width of the gate of transistors 1002 may be increased in each test circuit by 10%. Length of the gate typically has less effect on parameter drift variation.

Figure 11:
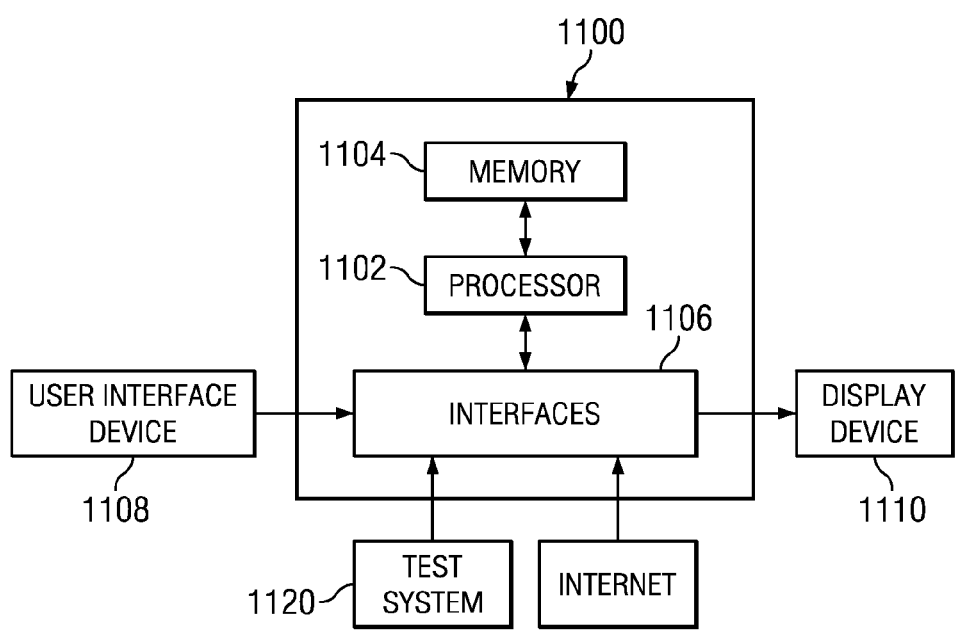
FIG. 11 is a block diagram of an exemplary design and simulation system.

FIG. 11 is a block diagram of an exemplary design and simulation system 1100. In another embodiment, a computer hosted design tool used to design and simulate circuit operation and may then incorporate a set of non-linear equations derived as described above, so that system operation may be simulated using various transistor geometries. The design tool may then select the appropriate transistor gate geometry to met specified operational requirements for a simulated system design. Design system 1100 includes one or more processors connected to one or more memories 1104 that holds program instructions that when executed by processor 1102 may determine or use non-linear equations that represent non-linear parameter drift over time for various transistor configurations. A user may provide manual input to the system via interface device(s) 1108 (mouse, keyboard, trackball, etc) coupled to interface logic 1106. The system may output interactive simulation results on one or more display devices 1110. The general operation of the simulator system aside from the use of the non-linear equations to predict parameter drift is well known and will not be described further herein. Based on projected parameter drift as predicted by the set non-linear equations, the design of the simulated system may be adjusted to improve end of life operation of the final system by determining an adequate but not excessive amount of guard-band for design of the system.

In one embodiment of the simulation system, a user or test system 1120 may provide the parameter drift data to system 1100 and an analysis program executed by processor 1102 determines the non-linear parameter drift equation (s) by analyzing the parameter drift data, as described in more detail with respect to FIGS. 1-8. In another embodiment, test system 1120 may determine the non-linear equations as described above and provide just the equations to simulation system 1100. In another embodiment, a user may determine the non-linear equations as described above using a separate computer system and provide just the equations to simulation system 1100 via the user interface or by other input means coupled to simulation system, such as via an internet connection.

Other Embodiments

While the invention has been described with reference to illustrative embodiments, this description is not intended to be construed in a limiting sense. Various other embodiments of the invention will be apparent to persons skilled in the art upon reference to this description that may be used to improve the cost versus performance tradeoff in designing a system. For example, embodiments may include any type of circuit or system where drift characteristics exhibit saturation behavior, such as non-linearity on log(Delta Drift) versus log(time) plots.

Embodiments are applicable to many types of transistors, circuits, and systems, both digital and analog, low frequency and radio frequency.

While the example described herein refers to output power as the parameter of interest, other embodiments of the invention may focus on a variety of parameters, such as frequency, propagation time, amplification factor, temperature sensitivity, or any other parameter that exhibits a non-linear drift over the life of the respective system or device.

While the example described herein refers to the operating voltage level as the stress level, other embodiments may focus on stress factors such as current, temperature, pressure, or any other stress factor that produces a non-linear drift over the life of the respective system or device.

While the example described herein used a power-law expression for the voltage acceleration factor, other embodiments may use other forms such as exponential, for example: $\exp(\alpha*V)$, where $\alpha$ is a constant.

While the example described herein used a log(y)-log(x) space for the parameter drift plots, other embodiments may use other non-linear space representations, such a linear-log or log-linear.

The determination and use of the non-linear equations may be implemented partially or completely as one or more executable instructions, as a state machine, as firmware, as synchronous or asynchronous custom control logic, or any other form of logic capable of performing the operations described herein. When implemented as an instruction(s) for execution by a processor, the instruction(s) may be executed within the processor by performing a series of microinstructions, by invoking a state machine, by invoking synchronous or asynchronous custom control logic, or by any other form of control logic capable of performing the operations described herein.

Although the invention finds particular application to systems implemented, for example, in an Application Specific Integrated Circuit (ASIC), it also finds application to other forms of systems. An ASIC may contain one or more megacells which each include custom designed functional circuits combined with pre-designed functional circuits provided by a design library.

An embodiment of the invention may include a system with a processor coupled to a computer readable medium in which a software program is stored that contains instructions that when executed by the processor perform the functions determining or using the non-linear parameter drift equations described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A method for predicting parameter drift in a system, the method comprising:
   recording a data set of parameter drifts over a period of time for each of a plurality of stress tests on the system at a corresponding plurality of stress levels;
   organizing each data set of the recorded parameter drifts as a plurality of parameter drift versus time plots;
   selecting a linear plot as a reference plot;
   time shifting the plots in relation to a reference plot by a time shift amount to form a single parameter drift plot, comprising:
      selecting the time shift amount by comparing each of the plurality of parameter drift versus time plots with the reference plot;
      time shifting the data sets for each of the plurality of stress tests by the time shift amount;
      replotting the time shifted data from all the test to create the single parameter drift plot;
   fitting a non-linear equation to the single parameter drift plot; and
   predicting an amount of parameter drift at a time beyond the period of time using the non-linear equation, wherein organizing each set of the recorded parameter drifts is performed in a log(y)-log(x) space;
   outputting interactively a plurality of simulation results on a display.

2. The method of claim 1, further comprising:
   determining a stress acceleration factor according to the plurality of stress levels and corresponding time shift amounts; and
   combining the stress acceleration factor with the non-linear equation, wherein the combined non-linear equation predicts an amount of parameter drift at a time beyond the period of time at any stress level within a range of stress levels.

3. The method of claim 2, wherein the stress level is an operating voltage of an amplifier and the parameter is an output voltage of the amplifier.

4. A method comprising:
   organizing a set of parameter drift data over a period of time in a non-linear space for each of a plurality of stress tests on a system operated at a corresponding plurality of stress levels;
   time shifting the sets of parameter drift data in relation to a reference set of parameter drift data by a time shift amount to form a single set of parameter drift data, comprising:
      selecting the time shift amount from comparing each of the plurality of parameter drift data with the reference set of parameter drift data;
      time shifting the parameter drift data sets for each of the plurality of stress tests by the time shift amount;
      forming the single set of parameter drift plot;
   fitting a non-linear equation to the single set of parameter drift data, wherein organizing each set of the recorded parameter drifts is performed in a log(y)-log(x) space; and
   outputting interactively a plurality of simulation results on a display.

5. The method of claim 4, further comprising predicting an amount of parameter drift at a time beyond the period of time using the non-linear equation.

6. The method of claim 4, further comprising:
   determining a stress acceleration factor according to the plurality of stress levels and corresponding time shift amounts; and
   combining the stress acceleration factor with the non-linear equation to form a second non-linear equation.

7. The method of claim 6, further comprising predicting an amount of parameter drift at a time beyond the period of time at any stress level within a range of stress levels using the second non-linear equation.

8. The method of claim 4, wherein the stress level is an operating voltage of an amplifier and the parameter is an output voltage of the amplifier.

9. The method of claim 4, wherein the method is performed by a simulation tool executed on a computer system.

10. The method of claim 5, modifying a component in the system in response to predicting an amount of parameter drift, whereby cost/performance of the system is improved.

11. A system for simulating circuit operation, the system comprising:
   a processor coupled to a memory, the memory holding software instructions that when executed by the processor, the processor is configured to:
   organize a set of parameter drift data over a period of time for each of a plurality of stress tests on a system at a corresponding plurality of stress levels in a non-linear space;
   time shift the sets of parameter drift data in relation to a reference set of parameter drift data by a time shift amount to form a single set of parameter drift data, comprising:
      selecting the time shift amount from comparing each of the plurality of parameter drift data with the reference set of parameter drift data;
      time shifting the parameter drift data sets for each of the plurality of stress tests by the time shift amount;
      forming the single set of parameter drift plot;
   fit a non-linear equation to the single set of parameter drift data, wherein organizing each set of the recorded parameter drifts is performed in a log(y)-log(x) space; and outputting interactively a plurality of simulation results on a display.

12. The system of claim 11, wherein the processor is further configured to predict an amount of parameter drift at a time beyond the period of time using the non-linear equation.

13. The system of claim 11, wherein the processor is further configured:
   determine a stress acceleration factor according to the plurality of stress levels and corresponding time shift amounts; and
   combine the stress acceleration factor with the non-linear equation to form a second non-linear equation.

14. The system of claim 11, wherein the processor is further configured to predict an amount of parameter drift at a time beyond the period of time at any stress level within a range of stress levels using the second non-linear equation.

* * * * *